United States Patent [19]
Gharaibeh

[11] 3,722,062
[45] Mar. 27, 1973

[54] COMPONENT INSERTION SYSTEM

[75] Inventor: Hashem M. Gharaibeh, Palatine, Ill.

[73] Assignee: Warwick Electronics Inc., Chicago, Ill.

[22] Filed: Nov. 4, 1971

[21] Appl. No.: 195,769

[52] U.S. Cl. ....................................29/203 B
[51] Int. Cl. ....................................H05k 13/04
[58] Field of Search...29/203 B, 203 R, 203 P, 208 C

[56] References Cited

UNITED STATES PATENTS

| | | | |
|---|---|---|---|
| 2,814,802 | 12/1957 | Maximoff | 29/203 B |
| 3,524,240 | 8/1970 | Walker et al. | 29/203 B |
| 3,670,385 | 6/1972 | Cropp | 29/203 R |
| 2,908,010 | 10/1959 | Lord et al. | 29/203 B |

OTHER PUBLICATIONS

Tooling & Production Magazine, March 1966 Pages 74, 75 "Advanced Numerical Control Applications"

*Primary Examiner*—Thomas H. Eager
*Attorney*—Axel A. Hofgren et al.

[57] ABSTRACT

An indexing conveyor transfers circuit boards between spaced insertion stations at which alignment pins clamp the circuit boards to fixed reference positions. A component insertion head and a clinch mechanism are horizontally driven about two axes to a programmed insertion position, and then are vertically driven to perform an insertion operation. After each insertion station inserts a plurality of different components at different programmed positions, the alignment pins are withdrawn and the conveyor is indexed. The index conveyor and all insertion stations are controlled by a time-shared computer which stores, for each insertion station, a separate program comprising sets of numerical control movement commands.

19 Claims, 4 Drawing Figures

COMPONENT INSERTION SYSTEM

BACKGROUND OF THE INVENTION

This invention relates to a component insertion system having a component insertion head automatically movable to plural programmed positions.

Prior component insertion lines have included a plurality of component insertion stations spaced along an indexing conveyor which transfers printed circuit boards between the insertion stations. Each insertion station has included an insertion head capable of inserting only one component at one predetermined position in the circuit board held by the index conveyor. In order to insert a large number of electronic components in one board, an equal number of individual insertion stations must be provided along a single insertion line, or the partially completed boards must be transferred for further insertion operations. Often, the boards are run through the same insertion line, which must be manually changed to insert a different series of components at different locations on the board. This requires an operator to manually preposition each insertion head to a new location, and replace its supply of components with a new supply of components. The manual change-over or set-up mode is very time consuming, and requires many operators if change-over time is to be minimized.

In an attempt to provide increased flexibility, individual insertion machines have been built in which a printed circuit board is clamped to a movable X–Y table under automatic or numerical control (NC). This allows one insertion machine to insert a plurality of components, reducing the total number of insertion machines which must be provided. The insertion head and the clinch mechanism, both of which are massive compared with the movable table carrying the circuit board, are mounted to a fixed frame.

The advantages gained by using an insertion machine having a movable table for carrying a circuit board are lost when several such machines are required in order to insert a large number of components. The necessary indexing conveyor becomes exceedingly complex because each circuit board must be transferred to and from the movable table, and the resulting increased complexity obviates the advantage of using fewer insertion machines. Since a transfer mechanism is necessary at each insertion machine, the indexing conveyor itself cannot be used as a work support.

With either type of insertion system described above, a line change-over for producing a new circuit board is a time consuming operation. The change-over problem is compounded when the new circuit board is of a different size or shape than the prior run board, or requires a considerably different number of components.

SUMMARY OF INVENTION

In accordance with the present invention, the applicant's novel component insertion system overcomes the disadvantages of prior component insertion systems. Each component insertion station comprises a component insertion head and a clinch assembly, both of which are automatically driven to programmed positions in order to insert plural components. A board index conveyor of simple design uses a chain belt to index spaced circuit boards to positions adjacent each movable insertion head and clinch assembly. Alignment pins are provided at each insertion station and are actuated to precisely locate the circuit boards with respect to the associated stations and to clamp the circuit boards to the index conveyor which itself serves as the work holder during the insertion operations.

The index conveyor and all insertion stations are controlled by a time-shared computer which stores a separate program for each insertion station. Each program contains a plurality of separate NC instructions for controlling the associated movable head and clinch mechanisms. The computer also controls a motor driven width adjustment on the conveyor in order to accommodate different size circuit boards, a motor driven index mechanism, and the alignment pin mechanisms. A line change-over is rapidly accomplished by simply altering the prestored data in the various computer programs.

One object of this invention is the provision of an improved component insertion system comprising a plurality of insertion stations, each station having an insertion head and a clinch mechanism both automatically movable to a plurality of programmed positions relative to a fixed circuit board.

Another object of this invention is the provision of an improved component insertion machine having a head assembly and a clinch mechanism commonly mounted to a member automatically movable to programmed positions in order to insert plural components.

While an illustrative embodiment of the invention is shown in the drawings and will be described in detail herein, the invention is susceptible of embodiment in many different forms and it should be understood that the present disclosure is to be considered as an exemplification of the principles of the invention and is not intended to limit the invention to the embodiment illustrated.

Other features and advantages of the invention will be apparent from the following description, and from the drawings.

DESCRIPTION OF THE PREFERRED EMBODIMENT

Figures 1, 2:
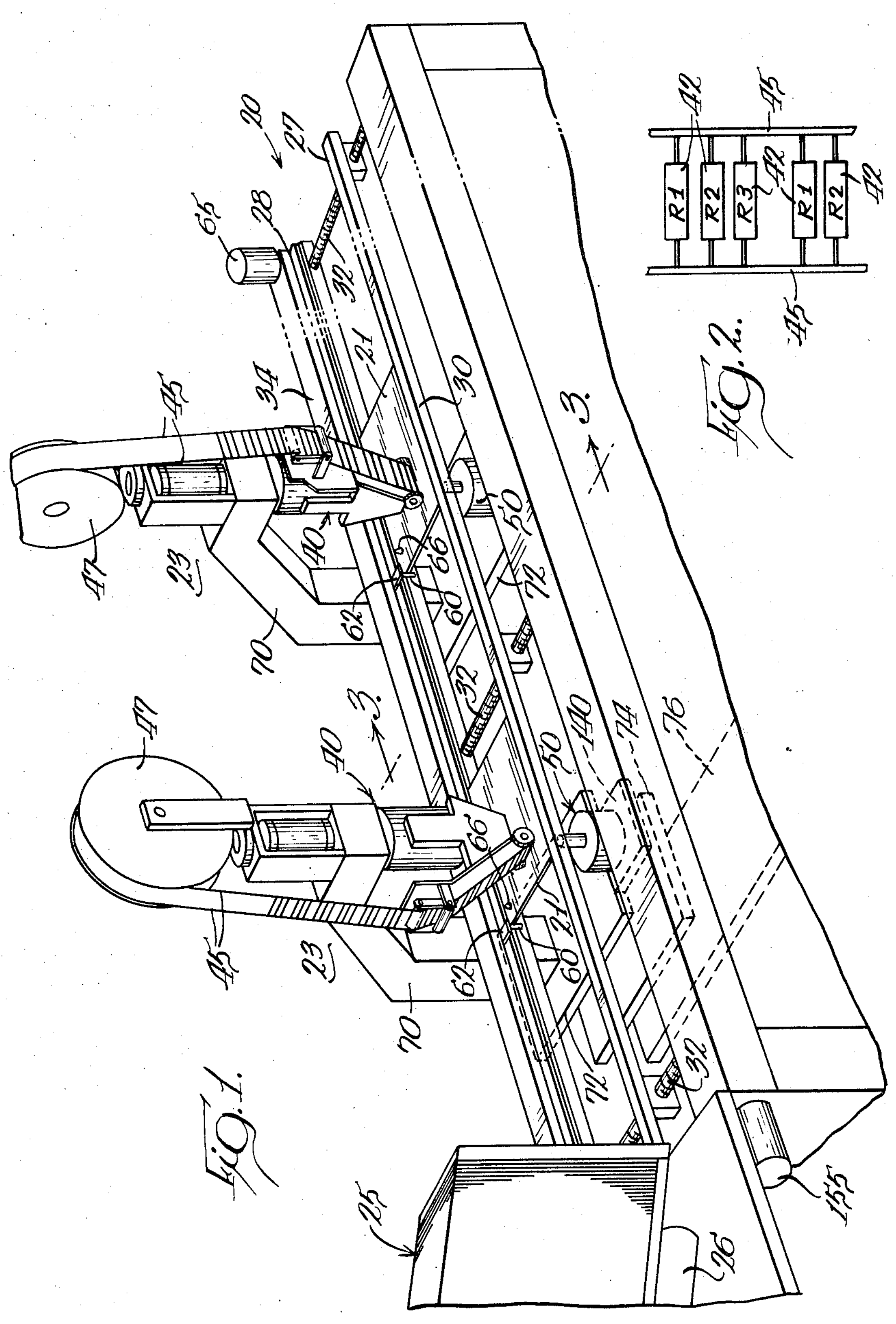
FIG. 1 is a perspective view of the component insertion system, with only two component insertion stations being illustrated for clarity.
FIG. 2 is a plan view of the components on a supply tape used by the component insertion stations of FIG. 1.

Turning to FIG. 1, the component insertion system includes an indexing conveyor 20 for moving a plurality of component carriers, such as printed circuit boards 21, between spaced component insertion stations 23, only two stations 23 being illustrated for clarity. In practice, a number of component insertion stations, such as 10, would be located along the conveyor 20. The printed circuit boards 21 are individually fed to conveyor 20 by an automatic board feeder station 25 of known construction. Station 25 consists of a storage hopper for holding a large number of circuit boards, a board straightener, and a board feeder actuated by a solenoid 26 for feeding a single board to a pair of tracks or channels 27 and 28 which form a board conveyor.

Channel 27 is formed by an L-shaped groove in an outer movable rail 30 which is continuously drivable to various widths with respect to channel 28 by movement of lead screws 32 spaced along the conveyor 20. Channel 28 is formed by a U-shaped groove in a fixed inner rail 34 which is fixed with respect to a frame secured to a floor or other support surface.

Each component insertion station 23 includes a component insertion head assembly 40 for inserting in the adjacent circuit board an individual component 42, see FIG. 2. The individual components 42 insertable by a single station 23 comprises similar size elements, such as one-quarter watt resistors of various electrical values, having axial leads secured to a pair of spaced belts 45 which are wound on a supply reel 47 for continuously supplying the head 40 with components. Each component insertion station 23 further includes a clinch mechanism 50 located along a vertical insertion axis and directly below the associated head assembly 40 for bending the axial leads of an individual component after it has been inserted by the head assembly 40.

Figure 3:
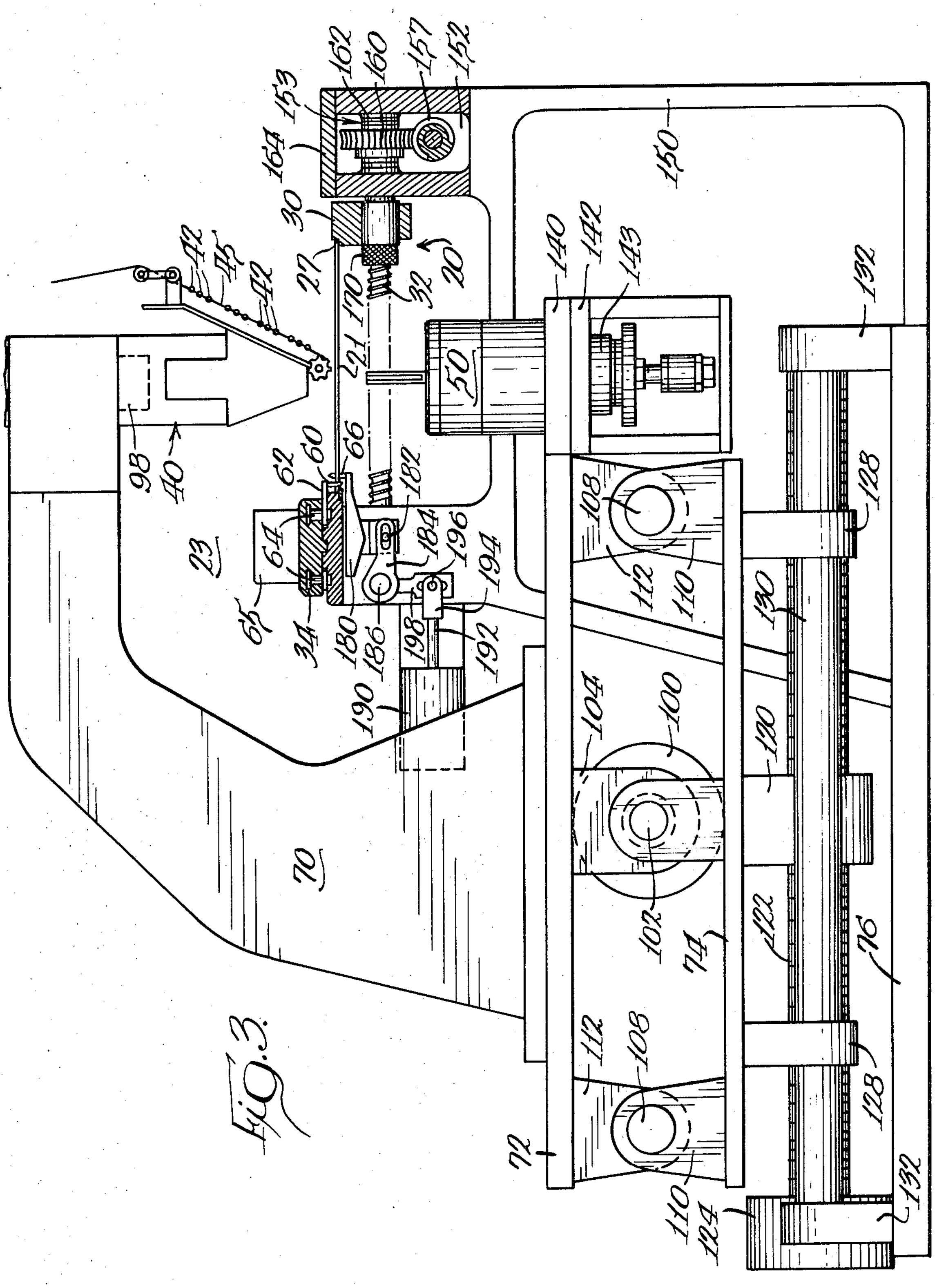
FIG. 3 is a plan view, partly in section, taken along lines 3—3 of FIG. 1 and showing a single component insertion station.

After an initial set-up procedure, to be described, individual circuit boards 21 are pushed through the pair of channels 27 and 28 by a downwardly extending pin 60 on a dog 62 attached to a chain belt 64, see FIG. 3. The chain belt is in the form of a continuous loop driven by a sprocket rotated by a line drive motor 65. After the circuit boards are driven to an approximate reference point, alignment pins 66 of conical shape rise through apertures in each circuit board 21 in order to exactly align and clamp the board to a precise reference point for that insertion station.

Each head assembly 40 and clinch mechanism 50 are then horizontally driven in an X–Y plane, parallel with the plane of the circuit board 21. For this purpose, each head assembly 40 is affixed to a C-frame 70 which is secured to an X-table 72 movable along an axis, arbitrarily designated X, which is parallel to the elongated conveyor channels 27 and 28. The clinch mechanism 50 is also secured to the X-table 72. In turn, the X-table 72 is movably mounted on a movable Y-table 74, driven along a skewed axis arbitrarily designated Y, located 90° from the X axis and parallel to screws 32. The Y-table 74 is movably mounted to a fixed base 76 which forms a part of the main frame for the component insertion system.

As seen in FIG. 1, the head mechanisms 40 can be manually rotated 90° on the C-frame 70 in order to insert components on the circuit boards in either of two normal directions. Suitable apparatus may of course be provided to automatically rotate the heads. Other intermediate positions for the head assembly 40 and clinch mechanism 50 could be provided, if desired. Also, while the insertable components have been illustrated as resistors, other insertion stations 23 can be provided for inserting jumper wires, electronic modules, as well as capacitors, inductors and the like.

After the head mechanism 40 and clinch mechanism 50 have inserted and clinched a component, the X-table 72 and Y-table 74 are driven to a new programmed position in order to insert the next component sequentially located on the belt 45. Each component insertion station 23 inserts a series of components before the conveyor 20 is indexed by motor 65. For example, a given insertion station may insert three similar size resistors, each of a different resistance value R1, R2 and R3, as illustrated in FIG. 2. A space or gap is located between the last component R3, and the first component R1, to provide a check, as will appear, that the insertion station is at the proper point for inserting the same series of components R1, R2 and R3 in the next circuit board.

After all component insertion stations 23 on the conveyor line 20 have completed inserting their programmed series of components, which may be of similar or different numbers of components at each station, the alignment pins 66 are withdrawn from all circuit boards and the line motor 65 is driven to cause the extending pins 60 to push the circuit boards to the next insertion stations.

The construction of an individual component insertion station 23, and the index conveyor 20, are shown in more detail in FIG. 3. The head assembly 40 includes a hydraulic head control 98 which is coupled to a common electrically actuated hydraulic control valve (not shown). Energization of this common control causes a portion of the head to move vertically downwardly, while bending the axial leads of a single component 42 which has been clipped from the supply belt 45. The details of the insertion head have not been illustrated as it forms no part of the invention, and any conventional insertion head may be mounted to the C-frame 70.

Head mechanism 40 is secured through C-frame 70 to the X-table 72, which is driven normal to the sheet of drawing by a motor 100 which rotates a screw 102. A threaded block 104 secured to the underside of the X-table 72, is driven by screw 102. The weight of the X-table and attached head assembly 40 is supported by a pair of smooth guide shafts 108 spaced on either side of the screw 102. Each guide shaft 108 is fixedly secured to an extending plate 110 which is fixedly secured to the Y-table 74. A pair of support plates 112 are fixedly mounted to the underside of the X-plate 72, and contain bearings through which the guide shafts 107 extend in order to slidably support the X-plate 72.

To drive and support the Y-table 74, a similar means is provided, but located 90° with respect to the above described means. A threaded block 120 is affixed to the underside of the Y-table 74, and meshes with an elongated screw 122 rotated by a motor 124 secured to the base plate 76. To support the weight of the Y-table, a pair of support plates 128 extend downwardly from the X-table 74, and each contain a bearing through which shafts 130 extend to slidably mount the Y-table. A pair of extending plates 132 secure the shafts 130 to the base plate 76.

To secure the clinch assembly 50 directly under the head 40, the X-plate 72 has an extending section 140 with a circular aperture for receiving the circular clinch assembly 50 therethrough. A clinch assembly frame 142 is secured to the underside of the X-table extension 140. A clinch up-down hydraulic control 143 is energizable by the common control valve to drive the mechanism upward in order to spread a pair of axial component leads, in a conventional manner. The details of the clinch mechanism have not been illustrated as it forms no part of the present invention, and any conventional clinch mechanism may be utilized as desired.

The index conveyor 20 is illustrated in cross-section in FIG. 3. A casting 150 supports the index conveyor a fixed distance above a floor or other support surface on which base plate 76 is also located. An outer portion of casting 150 includes a pair of spaced, upright flanges which define a chamber 152 containing a gear mechanism 153 for rotating screw 32 by a rail motor 155, illustrated in FIG. 1. Motor 155 rotates a drive shaft 156 which extends the length of the conveyor and through worm gears secured thereto drives the gear mechanisms 153 associated with each spaced rail adjustment screw 32. Gear mechanism 153 includes a worm gear 160 which meshes with worm screw 157 and rotates the ball screw 32 attached thereto. A bearing 162, attached to the outer flange, provides a rotatable mounting for the worm gear 160 and attached ball screw 32. The gears are protected in chamber 152 by a removable cover plate 164.

The ball screw 32 meshes with an internally threaded block 170 attached to the outer rail 30. As screw 32 rotates, the rail guide 27 is driven toward the opposite rail guide 26. When a new circuit board is to be run on the conveyor line, the rail motor 155 is automatically controlled to drive the lead screw 32 and thereby provide a width adjustment for the new circuit board.

To drive the circuit board 21 through the guide channel, inner rail 34 contains a pair of elongated hollow channels which contain the continuous loop chain belt 64. The vertical side of rail 34 adjacent the circuit board channel has a continuous elongated opening extending the length of the conveyor line, through which the dogs 62 and pins 60 extend in order to drive individual circuit boards. The opposite vertical side has a similar elongated slot opening to provide a return path for the dogs 62.

After the circuit boards are driven to an insertion station, precise positioning is provided by alignment pins 66, shown in FIG. 3 in an actuated position. Alignment pins 66 are connected to a locator assembly plate 180 which is restrained for solely vertical movement. The plate 180 has an extending drive pin 182 located within an elongated slot in a rotatable link 184 fixedly secured to an alignment shaft 186 which extends the length of the line conveyor.

A pin up-down hydraulic control 190 is located at an intermediate position for rotating the common drive shaft 186 in a counterclockwise direction, as viewed in FIG. 3, in order to pivot the link 184 at each station 23 and thereby simultaneously raise all alignment pins 66. When control 190 is deenergized, the alignment shaft is rotated in a clockwise direction and the alignment pins 66 are lowered. To rotate shaft 186, control 190 has a plunger 192 which connects to a head 194 having a pin 196 extending into a longitudinal slot formed in a drive link 198. The link 198 is fixedly attached to the alignment shaft 186. When the control 190 is energized, shaft 192 is driven out of the control, rotating drive link 198 and attached shaft 186 in a counterclockwise direction. Each of the alignment pins 66 have a conical shape in order to pilot the associated circuit board to a reference position as the pins are raised upwardly. The lowermost section of the pins 66 match the circular aperture in the circuit boards, thus clamping the boards to prevent any movement in a horizontal direction.

Figure 4:
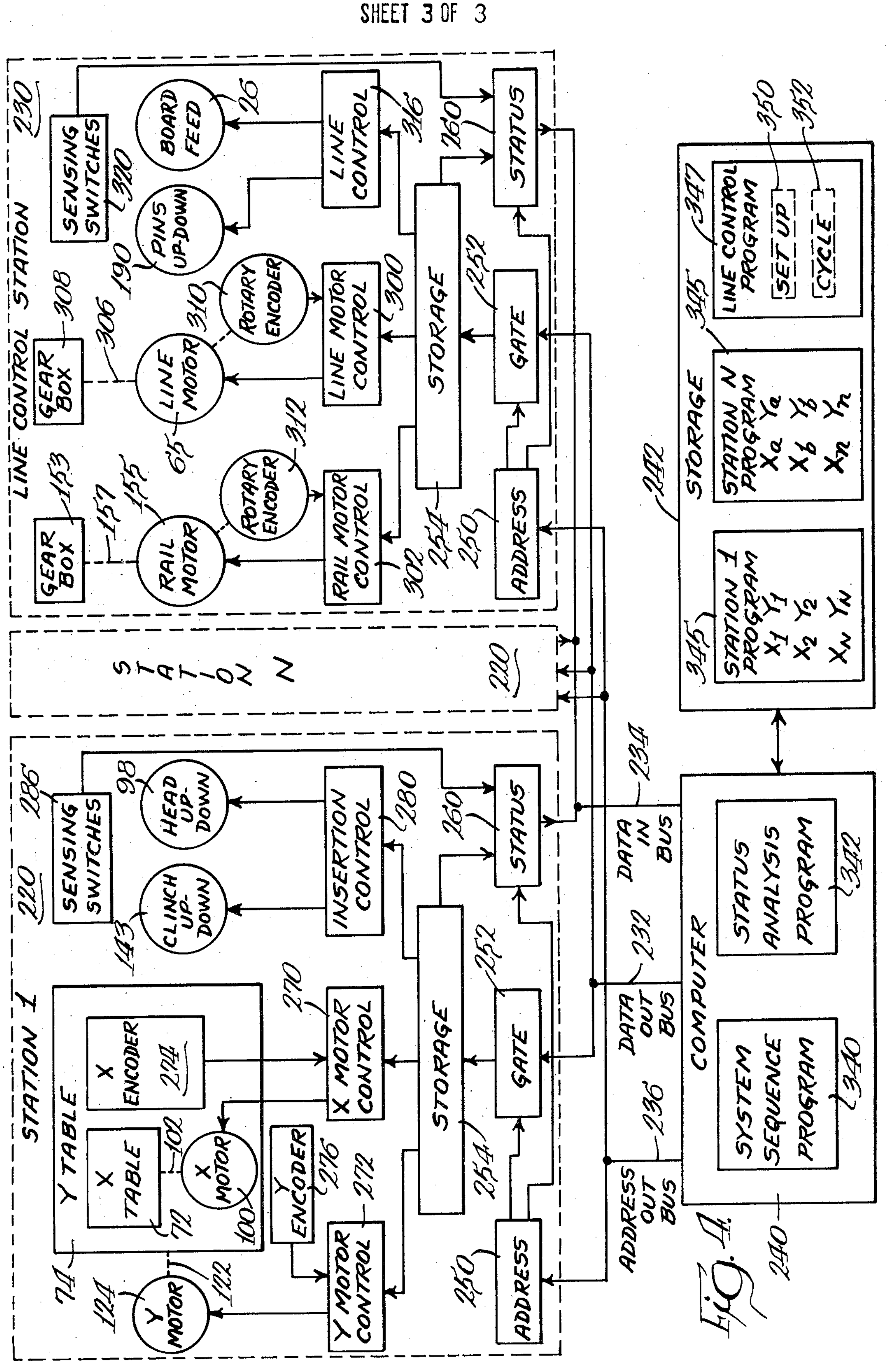
FIG. 4 is a block diagram of a control for the component insertion system of FIG. 1.

In FIG. 4, a control for the component insertion system is illustrated. For clarity, only as much of the control as is necessary for an understanding of the invention has been illustrated, the remainder being of unconventional construction known to those skilled in the art. Each insertion station 23 is controlled by an identical control unit 220. The conveyor line 20 is controlled by a control unit 230. All control units 220 and 230 are connected in parallel with a communications or data link which includes, in part, a data out bus 232, a data in bus 234, and an address out bus 236 from a general purpose digital computer 240, such as a NOVA minicomputer manufactured by Data General Corporation. INcluded in the computer 240 is a memory storage unit 242, which may provide 64,000 word storage, each word consisting of 16 bits.

Each control unit 220 and 230 is assigned a unique binary address which is recognized by an address recognition circuit 250. The address of any station may be changed by the operator to enable, for example, an idle station to take over the function of a malfunctioning active station. When data is to be received, circuit 250 opens a gate circuit 252 in order to pass the binary words on data out bus 232 into a control unit storage circuit 254. When data is to be transmitted, circuit 250 gates the contents, consisting of a status word, contained in a status circuit 260 onto the data in bus 234.

Storage circuit 254 in each insertion station unit 220 stores numerical control (NC) command instructions for controlling an X-motor control 270 and a Y-motor control 272. The X command instruction causes X-motor control 270 to drive the X-motor 100, rotating shaft 102 and moving X-table 72. The actual position of the X-table is sensed by an X-position encoder 274, suitably positioned to sense movement and provide a feedback signal to motor control 270 in order to position the X-table at the NC command location. Similarly, the Y command is coupled to Y-motor control 272 to drive Y-motor 124, rotating shaft 122 and moving the Y-table 74. A Y-position encoder 276 is suitably positioned to sense the actual movement of the Y-table, generating feedback pulses which are coupled to the Y-motor control 272. The above motor controls may take any conventional form well known in the numerical control art.

Storage circuit 254 also provides command instructions to an insertion control circuit 280 which actuates the common hydraulic control valve to operate the clinch up-down control 143 and the head up-down control 98. Each insertion station 220 also includes a plurality of sensing switches 286, of known construction, for determining whether a commanded movement has occurred. The sensing switches 286 determine (1) whether a component was in fact inserted, (2) whether a component is located in the next available position on the supply belt 45, FIG. 2, (3) whether the head has retracted, and (4) whether the clinch has retracted. Other sensing and interlocking functions can also be provided. The state of each bi-state sensing switch sets a corresponding bit in the status word stored in the status circuit 260.

The line control station 230 contains circuits generally similar to the station control 220. The storage circuit 254 provides length or index data to a line motor control 300, and rail width data to a rail motor control 302. The line motor control 300 drives the line motor 65, rotating a shaft 306 to drive through gear box 308 the chain belt 64, FIG. 3. Rotation of the line motor 304 is sensed by a rotary encoder 310 which provides feedback signals to the line motor control 300. Thus, each dog 62 is moved when a programmed linear distance which can be changed when the line itself is changed, as by changing the distance between insertion stations.

The rail motor control 302 drives the rail motor 155 in order to rotate shaft 157. Movement of rail motor 155 is sensed by a rotary encoder 312 which provides feedback signals in order to cause control 302 to move the outer rail 30 to a programmed width.

Storage circuit 254 in control unit 230 also provides binary instructions to a line control 316 which selectively actuates the pins up-down control 190 and the board feed solenoid 26. A plurality of sensing switches 320 are provided to sense that the programmed movements have in fact actually occurred. The closure of each sensing switch sets a bit in the status word stored in the status circuit 260. The sensing switches 320 detect (1) whether the alignment pins are retracted, and (2) whether a board has been fed to the line conveyor, as well as other conventional monitoring functions.

All storage circuits 254 have outputs to the status circuits 260 in order to indicate when the prior commanded instruction has been utilized. This may be indicated by gating of the stored instruction, or by counting down the stored instruction, or by other conventional NC techniques. Thus, the status word indicates the current state of the control unit, as well as indicating errors.

Computer 240 is time-shared with all control units in a conventional manner. Each control unit in the system is sequentially addressed, and then serviced depending on the state of the status word. A system sequence program 340 controls both a set-up routine or procedure for running new circuit boards, and a run routine or procedure for operating or cycling the system after completion of initial set-up. A status analysis program 342 analyzes the status word from each of the status circuits 260.

In storage memory 242, a board program 345 is provided for each insertion station 23 in the system. Each program 345 contains NC instructions for moving the insertion head 40 to a programmed X location and Y location, after which an insertion operation is automatically performed. For example, to insert the three resistors R1, R2 and R3 in FIG. 2, the location for each resistor is indicated by NC instructions defining the positions $X_1$, $Y_1$ for resistors R1; $X_2$, $Y_2$ for resistor R2; and $X_n$, $Y_n$ for Resistor R3. In order to control the line control station 230, a line control program 347 is provided, consisting of a set-up routine 350 effective when a new circuit board is to be run, and a cycle routine 352 effective to control the line conveyor during a normal run cycle.

The details of the program or routine for each of the above described programs form no part of the present invention, and is within the capabilities of one skilled in the programming arts. The programs are constructed to provide each of the features or functions previously described, or described in the following paragraphs.

When a new circuit board is to be run, the system sequence program 340 activates the set-up routine 350 in the line control program 347. By any conventional input, such as a keyboard, NC data is generated and stored in the set-up routine 350 to indicate the width of the circuit board to be run, and the distance between insertion stations. The latter adjustment allows the mechanical spacing between adjacent insertion stations to be changed. Since this dimension will very seldom change, the distance between insertion stations is typically entered once, and thereafter remains unchanged when running different types and widths of circuit boards.

System sequence program 340 now addresses the line section control 230, by placing its address on the address out bus 236, and thereafter transmits over data out bus 232 the programmed data stored in set-up routine 350. After the data is stored in storage circuit 254, the rail motor 155 is controlled and adjusts the outer rail to the proper programmed width and the line motor 65 adjusted for the length of the board. The system is now ready to run new circuit boards, which are placed in the board feeder 25.

A typical index cycle for the system will now be described. The system sequence program 340 activates the cycle routine 352, transmitting data to activate board feed solenoid 26 and then cause the line motor 65 to be driven the pre-programmed distance. Upon reaching the programmed distance, line control 316 is effective to energize the pins up-down hydraulic control 190, clamping all circuit boards in position.

System sequence program 340 now enables each station program 345 in sequence, causing the NC commands X, Y to be transmitted over data out bus 236 to the storage circuit 254 in the addressed control unit 220. For example, the address of Station 1 control unit 220 is placed on the address out bus 236, after which the data $X_1$, $Y_1$ is transmitted over the data out bus 232. After the NC data is completely stored, the associated X-motor 100 and Y-motor 124 are driven to the programmed position. Thereafter, the storage circuit 254 activates the insertion control 280, sequentially energizing the head hydraulic control 98 and then the clinch hydraulic control 143, followed by deenergization of both controls. Sensing switches 286 determine whether the programmed insertion operation did in fact occur. The status word in status circuit 260 is then set to indicate the completion of the first program insertion operation.

The computer 240 sequentially interrogates each of the status circuits 260 to determine whether a control unit requires servicing. For example, when the computer generates the address of Station 1 during a status check, the status word is transmitted to the status analysis program 342, which determines that Station 1 is ready for the next programmed instruction. This causes instruction $X_2$, $Y_2$ in the Station 1 program 345 to be transmitted over the data out bus 232 to Station 1. After a queue in program 340 receives an indication from program 342 that the last insertion station has completed all programmed insertion operations, the cycle routine 352 is activated in order to index the circuit boards and feed a new circuit board to the conveyor line.

The status analysis program 342 also determines if an error has occurred which requires a modification in the normal sequence of operations described above. If any of the sensing switches 286 or 320 indicate, for example, that a head 40 has not retracted upward, a clinch mechanism 50 has not retracted downward, or the alignment pins 66 have not retracted, then system sequence program 340 signals a system failure and blocks enabling of the cycle route 352. This prevents the line motor 304 from being energized, which would destroy some portion of the system due to an obstruction in the path of the circuit board conveyor.

In the event a board is not fed by actuation of board feed solenoid 318, the status analysis program 342 will detect this condition and causes the system sequence program 340 to repeat the board feed cycle. If a board cannot be fed after some predetermined number of times, a system failure is signalled. If a component is not inserted, the system sequence program 340 remembers the circuit board and the defect, and follows the circuit board as it is indexed through each insertion station. At an output station, the circuit board is rejected by energizing a conventional circuit board reject mechanism.

Between each series of components which are to be inserted on one circuit board by one insertion head, a gap or space is provided as illustrated in FIG. 2 between R3 and R1. One sensing switch 286 associated with each insertion head 40 detects whether a component is present for an insertion operation. The system sequence program 340 checks to determine that a "no component" detection after the first NC instruction $X_0$, $Y_0$ has been transmitted from the station program 345 associated with that insertion station. Should a component be present, an error has occurred and a system failure is indicated.

If an insertion station fails to insert a component in each of a predetermined number of sequential commanded insertions, that insertion station will be automatically deenergized and the operator alerted by system sequence program 340. The program 340 also allows any insertion station to in effect be bypassed, when desired.

When the circuit boards require more components than can be inserted by the ten insertion stations located along the index conveyor 20, then a second identical component insertion line may be provided, with a line cross-over mechanism for transferring the circuit board reaching the end of the illustrated line conveyor to the beginning of the second line conveyor. In such a cascaded system, the system sequence program 340 contains an additional routine for coordinating the operation of both insertion lines, since both insertion lines must finish all insertion operations before the line motors for both insertion lines are indexed. The control for the second insertion line is otherwise the same as previously described. Of course, the second insertion line can operate independent of the first insertion line, if desired, under control of the same computer 240 and disc storage unit 242, providing the capacity of the computer and the storage area are not exceeded. Each control unit for the additional insertion line is assigned a unique address different than the unique addresses already assigned to the control units for the first insertion line. Still further insertion lines can be added and operated in cascade or independent, following the above teaching.

The NC data stored in the station programs 345 and line program 347 may be read into memory by any conventional means, such as a punched tape or a manual data input. For station programs 345, the punched tape can be prepared by a device, generally similar to the illustrated insertion station in FIG. 3, which is manually moved to the position at which a component is to be inserted, and the resulting X, Y coordinates in a register connected to the X encoder and Y encoder are used to punch a tape. Such an input device, sometimes known as a "Co-ordinagraph" can be used to input programmed coordinates for each of the station programs 345. However, other known types of input devices can also be utilized.

I claim:

1. A component insertion system for inserting components in component carriers, comprising:
   - a plurality of component insertion head means each movable to a plurality of different component insertion positions in a plane skewed to an insertion axis along which each head means is further movable to perform an insertion operation;
   - conveyor means for transferring the carriers between said head means to positions which intersect said insertion axes, said conveyor means forming a work holder for the carriers during an insertion operation;
   - control means for automatically moving each head means through a programmed series of movements in said plane to said different positions, each completion of movement to a different position resulting in an insertion operation; and
   - index means effective after said programmed series of movements has been completed for indexing said conveyor means to transfer said carriers to adjacent head means.

2. The component insertion system of claim 1 wherein said control means includes for each head means a motor means for moving the associated head means through said series of movements in the plane and program means for storing data defining said series of movements in the plane, and sequence means for controlling each motor means in response to the data stored in the program means corresponding to the head means.

3. The component insertion system of claim 2 wherein said index means includes means responsive only after all of the data stored in all of said program means has completed controlling the associated head means for indexing said conveyor means.

4. The component insertion system of claim 2 wherein each head means has associated therewith motor means comprising a first motor device for driving a member along a first axis in said plane, head mounting means for mounting the head means to said member, clinch means for fastening inserted components to said carriers, clinch mounting means for mounting said clinch means to said member, a second motor device for effectively moving said member along a second axis skewed to said first axis and located in said plane, and said program means stores first motor data and second motor data for controlling said first motor device and said second motor device, respectively.

5. The component insertion system of claim 4 wherein said first motor device is secured on a movable table means, first gear means for connecting said member to said first motor means for movement relative to said table means, said second motor device is secured on a base means, second gear means for driving said table means by said second motor device to effectively move said member along said second axis, said conveyor means includes elongated channel means for transferring spaced carriers between said head means, frame means for locating said elongated channel means in a fixed position to form said work holder during said insertion operation, said frame means and said base means fixed with respect to each other.

6. The component insertion system of claim 1 wherein said conveyor means includes adjustable means movable to different positions to adapt said conveyor means to different carriers, said control means includes set-up program means containing data indicating a desired position for said adjustable means, and set-up motor means controlled by said set-up program means for automatically moving said adjustable means to the position indicated by the data.

7. The component insertion system of claim 6 wherein said conveyor means includes first elongated rail means and second elongated rail means for defining therebetween a carrier channel for holding component carriers therein, said adjustable means comprises means for relatively moving said rail means to alter the width of said carrier channel, and said set-up motor means drives said relatively moving means to vary the width of the carrier channel.

8. A component insertion system for inserting components in component carriers, comprising:

- a plurality of component insertion stations each including a component insertion head means having supply means for storing a recurring series of components and clinch means for fastening the components inserted by the head means, insertion control means for moving the head means and the clinch means along an insertion axis, and motor means for moving the head means and the clinch means in a plane skewed to said insertion axis;
- conveyor means including elongated channel means for holding spaced carriers therein and located to intersect the insertion axis of each of said plurality of insertion stations, line drive means for transferring the carriers held in said channel means between said plurality of insertion stations;
- a plurality of program means each associated with one of said insertion stations, each program means being capable of defining a plurality of distinct positions corresponding to different locations at which the series of components are to be inserted on each carrier;
- a plurality of station control means each associated with one of said insertion stations for operating said motor means and said insertion control means;
- link means for individually coupling the distinct positions defined by each program means to the station control means associated with the same insertion station for operating said motor means and then said insertion control means; and
- index means responsive to completion of the insertions defined by said plurality of program means for actuating said line drive means to transfer the carriers to the next insertion station.

9. The component insertion system of claim 8 wherein said conveyor means includes belt means extending along said elongated channel means and having extension means for abutting the spaced carriers to transfer the carriers with movement of the belt means, said line drive means moving said belt means when actuated by said index means.

10. The component insertion system of claim 9 wherein said conveyor means includes alignment pin means insertable in apertures in said carriers, alignment control means for moving said alignment pin means between an alignment position and a transfer position spaced therefrom, said index means actuating the alignment control means to move the pins to the alignment position after the line drive means has transferred the carriers to the adjacent insertion station.

11. The component insertion system of claim 8 wherein said elongated channel means comprises a pair of spaced rail means defining therebetween a channel for holding said spaced carriers, a plurality of adjustment means located at spaced positions along said elongated channel means for relatively moving said pair of rail means to change the width of the channel defined thereby, common drive means for simultaneously controlling each of said adjustment means to relatively move said rail means, rail motor means for driving said common drive means under control of width data, and set-up means for supplying width data to said rail motor means when a carrier of different width is to be transferred by said conveyor means.

12. The component insertion system of claim 11 wherein said common drive means comprises shaft means rotatable by said rail motor means to different rotational positions corresponding to different widths for said channel, each of said adjustment means comprises screw means rotatable to linearly move at least one of said rail means, and gear means for rotating said screw means by rotation of said shaft means.

13. The component insertion system of claim 8 wherein said link means includes time-shared computer means with storage means for storing said plurality of program means, data communications means for connecting said computer means with each of said station control means, and sequence means for individually distributing via said data communications means the distinct positions defined by each program means to the associated station control means.

14. The component insertion system of claim 13 wherein said conveyor means includes adjustment means movable to different positions to adapt said elongated channel means to different carriers, set-up drive means for moving said adjustment means under control of set-up data, said storage means further stores set-up routine means containing said set-up data, and said sequence means causes the set-up data to be communicated to said set-up drive means.

15. The component insertion system of claim 13 wherein said component insertion stations include sensing switch means for detecting the actual occurrence of a programmed operation, status means for storing status data defined by said sensing switch means, said computer means includes analysis means for decoding the status data from said status means and system sequence means responsive when the decoded status data indicates an error for disabling subsequent distribution of the distinct positions defined by the program means.

16. A component insertion machine for inserting components in a component carrier, comprising:

component insertion head means having supply means for storing a plurality of components which are to be inserted in said carrier and means movable along an insertion axis for inserting in said carrier an individual component from said supply means;

clinch means for fastening to said carrier the individual component inserted by said movable means;

frame means;

member means movable with respect to said frame means for mounting said insertion head means and said clinch means;

means for holding said carrier in a fixed position relative to said frame means, said fixed position being located between said head means and clinch means;

first motor means for producing a first movement under control of a first electrical signal;

first gear means coupled between said first motor means and said member means for moving said member means along a firxt axis skewed with respect to said insertion axis;

second motor means for producing a second movement under control of a second electrical signal;

second gear means effectively coupled between said second motor means and said member means for moving said member means along a second axis skewed with respect to both said first axis and said insertion axis, said first axis and said second axis defining a plane parallel to the orientation of the carrier by said holding means;

means for establishing a plurality of sets of first electrical signals and second electrical signals, each set of said signals defining a position in said plane at which one of said components is to be inserted; and means for repeatedly coupling each set of said signals from said establishing means to said first and second motor means to drive said head means and clinch means to said positions, said movable means being actuated when said head means and clinch means are located at said positions, whereby said machine automatically inserts a series of components in the same carrier.

17. The component insertion machine of claim 16 wherein said first gear means comprises means responsive to rotational movement for transversely moving said member relative to said first motor means, table means mounted for movement relative to said frame means, means mounting said first motor means to said table means, means mounting said second motor means to said frame means, and said second gear means comprises means responsive to rotational movement for transversely moving said table means relative to said second motor means.

18. The component insertion machine of claim 17 wherein said establishing means comprises time-shared computer means for generating said electrical signals, first storage means for storing the first electrical signals for controlling said first motor means, second storage means for storing the second electrical signals for controlling said second motor means, and said repeatedly coupling means comprises data link means for coupling the signals from said computer means to said first and second storage means.

19. The component insertion machine of claim 16 wherein said holding means comprise conveyor means for holding a plurality of spaced carriers therein, conveyor drive means for indexing the spaced carriers to a position which intersects insertion axis, and sequence means responsive after completion of indexing by said conveyor drive means for enabling said establishing means to generate the same sets of signals in order to insert said series of components in a different carrier.

* * * * *